United States Patent
Staudinger et al.

(10) Patent No.: US 9,774,299 B2
(45) Date of Patent: Sep. 26, 2017

(54) MODIFIABLE SIGNAL ADJUSTMENT DEVICES FOR POWER AMPLIFIERS AND CORRESPONDING METHODS AND APPARATUS

(71) Applicant: FREESCALE SEMICONDUCTOR, INC., Austin, TX (US)

(72) Inventors: Joseph Staudinger, Gilbert, AZ (US); Abdulrhman M. S. Ahmed, Gilbert, AZ (US); Paul R. Hart, Phoenix, AZ (US); Monte G. Miller, Phoenix, AZ (US); Nicholas J. Spence, Phoenix, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/500,992

(22) Filed: Sep. 29, 2014

(65) Prior Publication Data

US 2016/0094187 A1   Mar. 31, 2016

(51) Int. Cl.
*H03F 1/26* (2006.01)
*H03F 1/02* (2006.01)
(Continued)

(52) U.S. Cl.
CPC ......... *H03F 1/0288* (2013.01); *H03F 1/3247* (2013.01); *H03F 1/3282* (2013.01);
(Continued)

(58) Field of Classification Search
USPC ..................................... 330/149, 124 R, 107
(Continued)

(56) References Cited

U.S. PATENT DOCUMENTS

| | | |
|---|---|---|
| 2,210,028 A | 8/1940 | Doherty |
| 3,613,028 A | 10/1971 | Seidel |

(Continued)

FOREIGN PATENT DOCUMENTS

| | | |
|---|---|---|
| EP | 2017956 A1 | 1/2009 |
| EP | 2093879 A1 | 8/2009 |

(Continued)

OTHER PUBLICATIONS

Notice of Allowance mailed Apr. 28, 2015 for U.S. Appl. No. 14/287,139, 10 pages.

(Continued)

*Primary Examiner* — Patricia T Nguyen
(74) *Attorney, Agent, or Firm* — Sherry W. Schumm

(57) ABSTRACT

An embodiment of an amplifier system includes a modifiable signal adjustment device with an RF signal adjustment circuit coupled between first and second nodes. The RF signal adjustment circuit includes an adjustable phase shifter and an adjustable attenuator coupled in series with each other. The device also includes a memory and a controller circuit. The controller circuit retrieves a phase shift value and an attenuation value from the memory. The controller circuit then controls the adjustable phase shifter to apply a phase shift corresponding to the phase shift value to an input RF signal received at the first node, and controls the adjustable attenuator to apply an attenuation corresponding to the attenuation value to the input RF signal. Applying the phase shift and the attenuation results in an output RF signal at the second node.

14 Claims, 6 Drawing Sheets

(51) Int. Cl.
*H03F 3/19* (2006.01)
*H03F 1/32* (2006.01)
*H03F 3/24* (2006.01)

(52) U.S. Cl.
CPC .............. *H03F 3/19* (2013.01); *H03F 3/245* (2013.01); *H03F 2200/451* (2013.01); *H03F 2201/3233* (2013.01)

(58) Field of Classification Search
IPC ........................................................ H03F 1/26
See application file for complete search history.

(56) References Cited

U.S. PATENT DOCUMENTS

| | | |
|---|---|---|
| 3,671,885 A | 6/1972 | Pennypacker |
| 3,982,244 A | 9/1976 | Ward et al. |
| 4,002,971 A | 1/1977 | Rast et al. |
| 4,048,568 A | 9/1977 | Rast et al. |
| 4,477,781 A | 10/1984 | Reuss, Jr. et al. |
| 4,792,805 A | 12/1988 | Miglia |
| 4,975,604 A | 12/1990 | Barta |
| 4,987,378 A | 1/1991 | Eggleston et al. |
| 5,015,965 A | 5/1991 | Katz et al. |
| 5,148,062 A | 9/1992 | Goldfarb |
| 5,317,288 A | 5/1994 | Yung et al. |
| 5,349,364 A | 9/1994 | Bryanos et al. |
| 5,444,418 A | 8/1995 | Mitzlaff |
| 5,469,129 A | 11/1995 | Dydyk |
| 5,576,660 A | 11/1996 | Pouysegure et al. |
| 5,594,385 A | 1/1997 | Anvari |
| 5,884,143 A | 3/1999 | Wolkstein et al. |
| 5,929,804 A | 7/1999 | Jones |
| 5,969,572 A | 10/1999 | Jeong et al. |
| 5,986,500 A | 11/1999 | Park et al. |
| 6,006,111 A | 12/1999 | Rowland |
| 6,041,077 A | 3/2000 | Clark et al. |
| 6,070,090 A | 5/2000 | Feuerstein |
| 6,111,462 A | 8/2000 | Mucenieks et al. |
| 6,112,062 A * | 8/2000 | Hans ................ H03F 1/3241 330/149 |
| 6,163,210 A * | 12/2000 | Fukuchi ............ H03F 1/3229 330/151 |
| 6,208,204 B1 | 3/2001 | Suzuki et al. |
| 6,232,838 B1 | 5/2001 | Sugimoto |
| 6,236,286 B1 | 5/2001 | Hoffmann et al. |
| 6,255,908 B1 * | 7/2001 | Ghannouchi ......... H03F 1/3252 330/145 |
| 6,275,685 B1 * | 8/2001 | Wessel ................ H03F 1/3247 330/149 |
| 6,320,464 B1 | 11/2001 | Suzuki et al. |
| 6,356,149 B1 | 3/2002 | Stengel et al. |
| 6,515,544 B1 | 2/2003 | Suzuki et al. |
| 6,799,020 B1 * | 9/2004 | Heidmann ........... H03F 1/0294 330/107 |
| 6,972,621 B2 | 12/2005 | Matsuyoshi et al. |
| 7,071,775 B2 | 7/2006 | Gailus et al. |
| 7,078,976 B2 | 7/2006 | Blednov |
| 7,098,859 B2 | 8/2006 | Shimawaki et al. |
| 7,129,778 B2 | 10/2006 | Robinson |
| 7,167,693 B2 | 1/2007 | Bachman, II et al. |
| 7,205,817 B1 | 4/2007 | Huang et al. |
| 7,239,218 B2 | 7/2007 | Nakamura |
| 7,402,821 B2 | 7/2008 | Bernhardt |
| 7,427,895 B1 | 9/2008 | Okubo et al. |
| 7,518,448 B1 | 4/2009 | Blair et al. |
| 7,525,395 B2 | 4/2009 | Hwang et al. |
| 7,598,805 B2 | 10/2009 | Staudinger et al. |
| 7,626,455 B2 | 12/2009 | Ito et al. |
| 7,663,435 B2 | 2/2010 | Kim et al. |
| 7,680,467 B2 | 3/2010 | Ishigami |
| 7,683,828 B2 | 3/2010 | Stagliano et al. |
| 7,786,822 B2 | 8/2010 | Vice |
| 7,813,766 B1 | 10/2010 | Lam |
| 7,928,817 B2 | 4/2011 | Atsumo |
| 8,035,444 B2 | 10/2011 | Okubo |
| 8,195,118 B2 | 6/2012 | Warnick |
| 8,274,332 B2 | 9/2012 | Cho et al. |
| 8,354,882 B2 | 1/2013 | Blednov |
| 8,446,218 B2 | 5/2013 | Gong et al. |
| 8,493,143 B2 | 7/2013 | Khilia et al. |
| 8,514,007 B1 | 8/2013 | Ahmed et al. |
| 8,576,010 B2 | 11/2013 | Yanduru et al. |
| 8,606,206 B1 | 12/2013 | Lam et al. |
| 8,618,883 B2 | 12/2013 | Cho et al. |
| 8,653,890 B1 | 2/2014 | Ahmed et al. |
| 8,674,746 B1 | 3/2014 | Staudinger |
| 8,710,924 B2 | 4/2014 | van der Zanden et al. |
| 8,712,466 B2 | 4/2014 | Martineau et al. |
| 8,736,347 B2 | 5/2014 | Ahmed et al. |
| 8,736,365 B2 | 5/2014 | Correa et al. |
| 8,760,261 B2 | 6/2014 | Panchalan |
| 8,816,767 B2 | 8/2014 | Ahmed et al. |
| 8,957,734 B2 | 2/2015 | Ahmed et al. |
| 8,988,165 B2 | 3/2015 | Staudinger et al. |
| 9,407,477 B2 * | 8/2016 | Rozental .............. H04L 25/061 |
| 9,484,613 B1 * | 11/2016 | Simons ................. H01P 5/12 |
| 2002/0041209 A1 * | 4/2002 | Miyatani .............. H03F 1/3247 330/149 |
| 2003/0052734 A1 * | 3/2003 | Ishigami .............. H03F 1/3235 330/151 |
| 2005/0068102 A1 * | 3/2005 | Hongo ................. H03F 1/3258 330/149 |
| 2005/0195030 A1 * | 9/2005 | Okazaki ............... H03F 1/3247 330/149 |
| 2006/0044060 A1 | 3/2006 | Shiikuma |
| 2006/0091950 A1 * | 5/2006 | Hayase ................ H03F 1/3247 330/149 |
| 2008/0039024 A1 | 2/2008 | Ikeda et al. |
| 2008/0111622 A1 | 5/2008 | Sperlich et al. |
| 2008/0238544 A1 | 10/2008 | Morris et al. |
| 2009/0167434 A1 | 7/2009 | Elmala |
| 2009/0206928 A1 | 8/2009 | Bowles et al. |
| 2010/0026387 A1 | 2/2010 | Blednov |
| 2010/0148860 A1 * | 6/2010 | Rhodes ................. H03F 3/602 330/2 |
| 2010/0156528 A1 | 6/2010 | Couchman et al. |
| 2010/0227599 A1 | 9/2010 | Vella-Coleiro et al. |
| 2012/0224653 A1 | 9/2012 | Lozhkin |
| 2012/0294387 A1 | 11/2012 | Ghannouchi et al. |
| 2012/0299765 A1 | 11/2012 | Huang |
| 2013/0241640 A1 | 9/2013 | Lin et al. |
| 2014/0077874 A1 | 3/2014 | Ahmed et al. |
| 2014/0253248 A1 | 9/2014 | Ahmed et al. |
| 2015/0054582 A1 * | 2/2015 | Goss ................... H03F 1/3247 330/279 |
| 2015/0091653 A1 | 4/2015 | Kobayashi et al. |

FOREIGN PATENT DOCUMENTS

| | | |
|---|---|---|
| EP | 2521257 A1 | 7/2012 |
| JP | 2003209447 A | 7/2003 |
| JP | 2005117599 A | 4/2005 |
| JP | 2010273212 A | 12/2010 |
| SU | 1737577 A1 | 5/1992 |
| WO | 2013006943 A1 | 1/2013 |

OTHER PUBLICATIONS

Non-Final Rejection mailed May 20, 2015 for U.S. Appl. No. 14/086,520, 7 pages.
Extended European Search Report mailed Sep. 14, 2015 for EP 141897014, 13 pages.
Notice of Allowance mailed Sep. 28, 2015 for U.S. Appl. No. 14/066,601, 8 pages.
Chen, Jiashu et al., "Design and Analysis of a Stage-Scaled Distributed Power Amplifier," IEEE Transactions on Microwave Theory and Techniques, vol. 59, No. 5, pp. 1274-1283, May 2011.
Darraji, Ramzi et al., A Dual-Input Digitally Driven Doherty Amplifier Architecture for Performance Enhancement of Doherty Transmitters, IEEE Transactions on Microwave Theory and Techniques, vol. 59, No. 5, pp. 1284-1293, May 2011.

(56) References Cited

OTHER PUBLICATIONS

Hsu, Sen-Kuei et al., "A Novel Compact Forward-Wave Directional Coupler Design Using Periodical Patterned Ground Structure," IEEE Transactions on Microwave Theory and Techniques, vol. 59, No. 5, pp. 1249-1257, May 2011.

Lane, A.A. "GaAs MMIC Phase Shifters for Pahse Arrays;IEEE Colloquim on Solid State Components for Radar"; pp. Mar. 1-5, 1988.

Mortazy, Ebrahim et al., "Mode Coupling Between Substrate Integrated Waveguide and Coplanar Waveguide for Traveling-Wave Electrooptical Modulator," IEEE Transactions on Microwave Theory and Techniques, vol. 59, No. 5, pp. 1258-1264, May 2011.

Sazegar, Mohsen et al., "Low-Cost Phased-Array Antenna Using Compact Tunable Phase Shifters Based on Ferroelectric Ceramics," IEEE Transactions on Microwave Theory and Techniques, vol. 59, No. 5, pp. 1265-1273, May 2011.

Zawrotny, K. et al., "C-Band 4-Bit Phase Shifter MMIC"; Microwaves, Radar and Wireless Communications 2008; Mikon 2008 17th international conference; 4 pages.

Notice of Allowance mailed Oct. 29, 2013 for U.S. Appl. No. 13/653,155, 9 pages.

Notice of Allowance mailed Oct. 9, 2013 for U.S. Appl. No. 13/656,551, 10 pages.

Notice of Allowance mailed Apr. 16, 2014 for U.S. Appl. No. 14/152,081, 8 pages.

Notice of Allowance mailed Oct. 3, 2014 for U.S. Appl. No. 14/464,270, 8 pages.

Non-Final Office Action mailed Mar. 24, 2015 for U.S. Appl. No. 14/066,601, 7 pages.

Notice of Allowance mailed Apr. 2, 2015 for U.S. Appl. No. 14/086,520, 9 pages.

Non-Final Office Action mailed Dec. 23, 2013 for U.S. Appl. No. 13/360,119, 8 pages.

Notice of Allowance mailed Nov. 20, 2014 for U.S. Appl. No. 13/360,119, 7 pages.

U.S. Appl. No. 14/066,601, filed Oct. 29, 2013, entitled "Adaptive Adjustment of Power Splitter".

EP Application 13151802.9 Search Report, dated Jan. 13, 2015, 13 pages.

Final Rejection mailed Oct. 15, 2014 for U.S. Appl. No. 14/086,520, 5 pages.

Non-Final Rejection mailed Feb. 7, 2013 for U.S. Appl. No. 13/360,473, 7 pages.

Non-Final Rejection mailed Jul. 1, 2014 for U.S. Appl. No. 14/086,520, 9 pages.

Non-Final Rejection mailed Oct. 9, 2014 for U.S. Appl. No. 14/287,139, 12 pages.

Non-Final Rejection mailed Sep. 10, 2013 for U.S. Appl. No. 13/959,254, 10 pages.

Notice of Allowance mailed Jan. 7, 2014 for U.S. Appl. No. 13/959,254, 7 pages.

Notice of Allowance mailed Mar. 18, 2015 for U.S. Appl. No. 14/287,139, 8 pages.

Notice of Allowance mailed May 16, 2013 for U.S. Appl. No. 13/360,473, 9 pages.

EP Application 13151802.9, Partial Search Report, dated Sep. 26, 2014, pp. 1-8.

Partial European Search Report mailed Mar. 15, 2015 for EP 141897014, 8 pages.

Final Rejection mailed Jul. 9, 2015 for U.S. Appl. No. 14/066,601, 4 pages.

Fardin et al, "Electronically tunable lumped element 90 degree hybrid coupler", Electronics Letters, Mar. 2006, pp. 1-2, vol. 42, No. 6.

Gysel, "A New N-way Power/Divider/Combiner Suitable for High-Power Applications", 1975 IEEE-MTT-S International Microwave Symposium, May 2015, pp. 116-11.

Non-Final Office Action dated Oct. 23, 2015 for U.S. Appl. No. 14/728,196, 13 pages.

Non-Final Rejection dated Oct. 17, 2016 for U.S. Appl. No. 14/925,718, 5 pages.

Notice of Allowance dated Mar. 1, 2017 for U.S. Appl. No. 14/925,718, 7 pages.

Non-Final Office Action dated Jul. 10, 2017 for U.S. Appl. No. 15/393,473, 9 pages.

\* cited by examiner

300 ↘

| INDEX | OPERATIONAL CONDITIONS | | | ATT 1 | ATT 2 | PHASE 1 | PHASE 2 |
|---|---|---|---|---|---|---|---|
| | FREQUENCY | TEMP | POWER | | | | |
| 1 | 2110 | 0 | 1 | 0 | 0 | 0 | 0 |
| 2 | 2110 | 0 | 5 | 0 | 0.5 | 0 | 7 |
| ... | ... | ... | ... | ... | ... | ... | ... |
| 31 | 2110 | 150 | 30 | 7.5 | 7.5 | 21 | 49 |
| 32 | 2130 | 0 | 1 | 0 | 0 | 7 | 14 |
| ... | ... | ... | ... | ... | ... | ... | ... |
| 255 | 2200 | 150 | 25 | 7.5 | 7.5 | 35 | 49 |
| 256 | 2200 | 150 | 30 | 7.5 | 7.5 | 42 | 49 |

| INDEX | ATT 1 | ATT 2 | PHASE 1 | PHASE 2 |
|---|---|---|---|---|
| 1 | 0 | 0 | 0 | 0 |
| 2 | 0 | 0.5 | 0 | 7 |
| ... | ... | ... | ... | ... |
| 31 | 7.5 | 7.5 | 21 | 49 |
| 32 | 0 | 0 | 7 | 14 |
| ... | ... | ... | ... | ... |
| 255 | 7.5 | 7.5 | 35 | 49 |
| 256 | 7.5 | 7.5 | 42 | 49 |

MODIFIABLE SIGNAL ADJUSTMENT DEVICES FOR POWER AMPLIFIERS AND CORRESPONDING METHODS AND APPARATUS

FIELD OF THE INVENTION

This invention relates to power amplifiers in general and more specifically to techniques and apparatus for adjusting the phase shifts and/or amplitudes of signals processed by power amplifiers.

BACKGROUND OF THE INVENTION

With the advent of new telecommunication systems, it can become increasingly difficult to provide power amplifiers that exhibit desired linearity characteristics. This may be particularly true for the amplifiers driving base stations in communications networks, where the network are operating as fifth generation or beyond fourth generation—long term evolution (LTE) networks.

In such applications, amplifiers that are more linear are more easily corrected using digital predistortion (DPD) techniques, further improving the amplifier's efficiency and potentially simplifying the overall amplifier implementation. A power amplifier's non-linearity can be attributed, at least in part, to a number of intrinsic nonlinearities occurring within the power transistors of the amplifier, such as variances in the transistor's gain, and gate-to-source and gate-to-drain capacitances.

One specific type of power amplifier used in wireless communication systems is a Doherty amplifier. Doherty amplifiers can be suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This can enable improved power-added efficiency and linearity of the amplifier, as compared to a balanced amplifier, at the power levels commonly encountered in wireless communications applications. However, the performance of a Doherty amplifier also may be affected by various nonlinearities occurring within the main and peaking amplification paths.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3 illustrates an example of a calibration table, in accordance with an embodiment;

FIG. 4 illustrates an example of a lookup table, in accordance with an embodiment;

DETAILED DESCRIPTION

In overview, the present disclosure concerns techniques and apparatus for independently adjusting the signals processed along one or more amplification paths of a power amplifier. For example, embodiments of signal adjustment devices and methods of their operation may be used to process signals along main and peaking paths of a Doherty power amplifier. Embodiments may be used in other types of single path or multiple path power amplifiers, as well (e.g., switched mode power amplifiers (SMPAs), envelope elimination and restoration (EER) amplifiers, linear amplifiers using a non-linear component, and so on).

Figure 1:
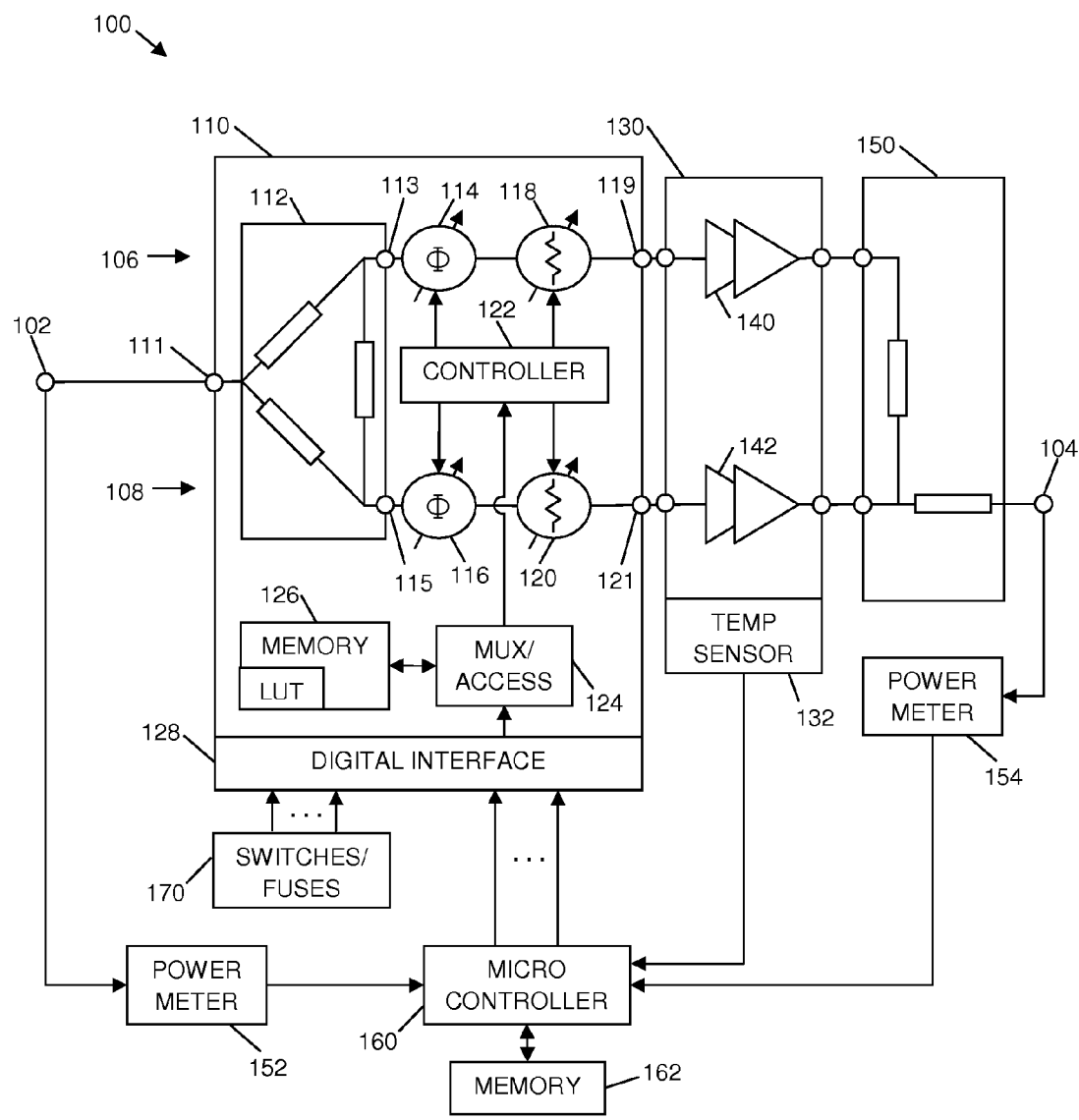
FIG. 1 illustrates, in block diagram form, a modifiable signal adjustment device incorporated in a system that includes a Doherty power amplifier, in accordance with an embodiment.

FIG. 1 illustrates, in block diagram form, a modifiable signal adjustment device 110 incorporated in a system 100 that includes a Doherty power amplifier, in accordance with an embodiment. Amplifier system 100 includes an input terminal 102, an output terminal 104, the modifiable signal adjustment device 110, an amplifier circuit 130, and a combiner circuit 150, according to an embodiment. The signal adjustment device 110 has an input node 111 and multiple output nodes 119, 121, and is coupled between input terminal 102 and input terminals (not labeled) to the amplifier circuit 130. The combiner circuit 150 is coupled between output terminals (not labeled) of the amplifier circuit 130 and output terminal 104. An input signal received at input terminal 102 (e.g., a radio frequency (RF) signal) is amplified by amplifier system 100 and provided to a load (e.g., an antenna, not illustrated) via output terminal 104.

Amplifier system 100 is configured in a Doherty amplifier topology, which includes multiple amplifier stages 140, 142 along parallel amplification paths 106, 108, each of which may supply current to a load (e.g., an antenna, not illustrated). More specifically, amplifier system 100 is a two-stage Doherty amplifier, which includes a main amplifier stage 140 (biased in a class-AB mode during operation) along a first amplification path 106, and a peaking amplifier stage 142 (biased in a class-C mode during operation) along a second amplification path 108. At input power levels below the threshold of the peaking amplifier stage 142, only the main amplifier stage 140 provides current to the load. At input power levels exceeding the threshold of the peaking amplifier stage 142, signals output from both the main and peaking amplifier stages 140, 142 are summed in-phase by combiner circuit 150 to provide current to the load.

In other embodiments, amplifier system 100 may include a main amplifier stage and two or more peaking amplifier stages, with each peaking amplifier stage being biased at a different class-C operating point. Accordingly, although amplifier system 100 includes only two amplification paths 106, 108, an amplifier system may include three (or more) amplification paths, in alternate embodiments. In addition, although embodiments of Doherty amplifier topologies are discussed in detail herein, those of skill in the art would understand, based on the description herein, that the embodiments may be implemented in amplifiers having topologies other than Doherty amplifier topologies. In addition, embodiments may be implemented in amplifiers having one, two, or more amplification paths.

Signal adjustment device 110 includes a power splitter 112, multiple RF signal adjustment circuits (including elements 114, 116, 119, 120), a controller circuit 122, a signal diversion and memory access circuit 124 (referred to as MUX/access circuit 124 or "diversion circuitry"), memory 126, and a digital interface 128. The power splitter 112 is configured to split the power of the input signal received at terminal 102 and node 111 into two signals provided to the two amplification paths 106, 108 at nodes 113 and 115, respectively. The power splitter 112 also may apply phase shifts to either or both signals to achieve a phase difference (typically a value of 90 degrees) between the signal carried along one of the amplification paths (e.g., along amplification path 108) and the signal carried along the other amplification path. In other words, power splitter 112 adjusts the phase(s) of either or both signals so that the signals carried along the two amplification paths 106, 108 are out of phase (e.g., 90 degrees out of phase), with respect to each other. This may be achieved, for example, using eighth or quarter wave length transmission line(s) or by other means. The power splitter 112 may divide the input power equally between the amplification paths 106, 108, such that roughly 50 percent of the input signal power is provided to each amplification path 106, 108. Alternatively, the power splitter 112 may divide the input power unequally between the amplification paths 106, 108.

The RF signal adjustment circuits are coupled between the outputs of the power splitter 112 (or nodes 113, 115) and the inputs to the amplifier stages 140, 142 (or nodes 119, 121). For example, a first RF signal adjustment circuit may include a first adjustable phase shifter 114 and a first adjustable attenuator 118 coupled between nodes 113, 119 along the first amplification path 106, and a second RF signal adjustment circuit may include a second adjustable phase shifter 116 and a second adjustable attenuator 120 coupled between nodes 115, 121 along the second amplification path 108. The adjustable phase shifters 114, 116 and adjustable attenuators 118, 120 enable adjustments to be made in the phase and amplitude (or attenuation) of the signals along amplification paths 106, 108, in order to provide optimal balancing between the RF signals provided to amplifier stages 140, 142.

According to an embodiment, each phase shifter 114, 116 may be digitally controlled to apply one of a plurality of discrete phase shifts to the signals along paths 106, 108, respectively. Similarly, each attenuator 118, 120 may be digitally controlled to apply one of a plurality of discrete attenuation levels to the signals along paths 106, 108, respectively. For example, each phase shifter 114, 116 may be configured to apply one of eight phase shifts, with a step size of about 7.0 degrees between each selectable phase shift value (e.g., the range of phase shifts may be between about 0 degrees and about 49 degrees, with about 7.0 degrees between each selectable phase shift value). As a further example, each attenuator 118, 120 may be configured to apply one of 16 discrete attenuation levels, with a step size of about 0.5 decibels (dB) between each selectable attenuation level (i.e., the range of attenuation levels may be between about 0 dB and about 7.5 dB, with about 0.5 dB between each selectable attenuation level). In the above described embodiment, three bits may be used to convey any of the eight selectable phase shift values, and four bits may be used to convey any of the 16 selectable attenuation levels. In alternate embodiments, a system may support more or fewer selectable phase shift values, more or fewer selectable attenuation levels, different step sizes between phase shifts and/or attenuations, and/or different numbers of bits to convey the selectable phase shifts and/or attenuations.

Although the adjustable phase shifters 114, 116 are shown to precede the adjustable attenuators 118, 120 along amplification paths 106, 108, the phase shifters 114, 116 and attenuators 118, 120 may be reversed in order, in an alternate embodiment. Further, some embodiments may include only adjustable phase shifters (e.g., phase shifters 114, 116) or only adjustable attenuators (e.g., attenuators 118, 120), but not both. Further still, some embodiments may have the RF signal adjustment circuits coupled between the outputs of the amplifier stages 140, 142 and the inputs to the combiner circuit 150, instead of or in addition to being coupled to the inputs of the amplifier stages 140, 142.

Within amplifier circuit 130, amplifier stages 140, 142 each are configured to amplify the RF signals provided at nodes 119 and 121, respectively, by the RF signal adjustment circuits. According to an embodiment, amplifier stages 140, 142 may be packaged together in a single device package, which may be an air cavity or overmolded package. The amplifier circuit 130 also may include input and/or output impedance matching circuits coupled to each of the amplifier stages 140, 142, in an embodiment. Either or both the input and/or output impedance matching circuits may be included within the same device package as amplifier stages 140, 142. Alternatively, either or both the input and/or output impedance matching circuits may be external to the device package within which amplifier stages 140, 142 are included.

After amplification of the RF signals carried on the first and second amplification paths 106, 108 by the amplifier stages 140, 142, the amplifier RF signals are combined by combiner circuit 150. The combiner circuit 150 also may apply a phase shift (typically a value of 90 degrees achieved using quarter wave length transmission line) to the signal carried along one of the amplification paths (e.g., along amplification path 106), for example, so that the signals carried along the two amplification paths 106, 108 are summed in phase before being provided to the output terminal 104.

According to an embodiment, based on control signals provided by controller circuit 122, the first and second adjustable phase shifters 114, 116 apply phase shifts to the signals conveyed along the first and second amplification paths 106, 108. Similarly, based on control signals provided by controller circuit 122, the first and second adjustable attenuators 118, 120 attenuate the signals conveyed along the first and second amplification paths 106, 108. For example, the first and second adjustable phase shifters 114, 116 may include a configuration of switches (e.g., transistors) that may be controlled to achieve a desired signal phase shift, and the controller circuit 122 may produce switch control signals that affect the states of the switches. Similarly, the first and second adjustable attenuators 118, 120 may include a configuration of switches (e.g., transistors) that may be controlled to achieve a desired attenuation level, and the controller circuit 122 may produce switch control signals that affect the states of the switches.

As mentioned previously, signal adjustment device 110 also includes MUX/access circuit 124, memory 126, and digital interface 128, in accordance with an embodiment. The configuration and functioning of these components now will be described in more detail.

MUX/access circuit 124 is coupled to controller circuit 122, memory 126, and digital interface 128. According to an embodiment, the controller circuit 122 includes one or more inputs for receiving signals from MUX/access circuit 124. More specifically, the signals indicate the phase shifts and attenuations to be applied by each of the adjustable phase shifters 114, 116 and the adjustable attenuators 118, 120 at any given time. Essentially, the controller circuit 122 converts the signals from MUX/access circuit 124 into control signals (e.g., switch control signals) that are provided to the adjustable phase shifters 114, 116 and adjustable attenuators 118, 120. In alternate embodiments, the controller circuit 122 may be coupled directly to memory 126 and/or digital interface 128, and may receive the phase shift and attenuation signals directly from the memory 126 and/or the digital interface 128. In such an embodiment, MUX/access circuit 124 may be excluded from the device 110.

MUX/access circuit 124 includes one or more multiplexers or other logic configured to route signals between digital interface 128, memory 126, and controller circuit 122. In addition, MUX/access circuit 124 includes memory access circuitry configured to write data to and read data from memory 126. Further, MUX/access circuit 124 includes circuitry configured to control its routing and data access functions based on various signals received through the digital interface 128, as will be described in more detail below.

Controller circuit 122 receives, from MUX/access circuit 124, signals indicating the phase shifts and attenuations that controller circuit 122 should cause the adjustable phase shifters 114, 116 and adjustable attenuators 118, 120 to apply along amplification paths 106 and 108. In order to provide the phase shift and attenuation values to controller circuit 122, MUX/access circuit 124 may access phase shift and attenuation data stored within memory 126. Memory 126 includes some form of non-volatile memory (e.g., read only memory (ROM) (including programmable ROM (PROM), erasable PROM (EPROM), electrically erasable PROM (EEPROM)), flash memory, nonvolatile random access memory (NVRAM), and so on), in an embodiment, although the memory 126 also or alternatively may include volatile memory.

According to a specific embodiment, the phase shift and attenuation data is stored in a phase shift and attenuation lookup table (LUT) within memory 126, where the LUT includes a plurality of addressable LUT entries. As will be described in more detail later in conjunction with FIG. 2, the phase shift and attenuation data for the LUT may be determined by external calibration equipment during a calibration procedure, and the phase shift and attenuation data may then be clocked into the device 110 and stored in memory 126.

In the illustrated embodiment, which includes two adjustable phase shifters 114, 116 and two adjustable attenuators 118, 120, each of the LUT entries includes first and second phase shift value fields, and first and second attenuation value fields. A first phase shift value (indicating a phase shift to be applied by phase shifter 114) is stored within the first phase shift value field, a second phase shift value (indicating a phase shift to be applied by phase shifter 116) is stored within the second phase shift value field, a first attenuation value (indicating an attenuation to be applied by attenuator 118) is stored within the first attenuation value field, and a second attenuation value (indicating an attenuation to be applied by attenuator 120) is stored within the second attenuation value field. In alternate embodiments that include only a single amplification path, more than two amplification paths, only adjustable phase shifter(s), and/or only adjustable attenuator(s), the fields in the LUT entries may be configured accordingly, as would be apparent to one of skill in the art based on the description herein.

Each LUT entry may be identified by a unique address or index, and the number of bits used to indicate the address or index of a particular LUT entry depends on the number of LUT entries in the LUT. For example, for a LUT that includes 256 LUT entries, eight bits may be used to identify any of the 256 LUT entries. More or fewer LUT entries and bits may be supported in a system. LUT entry selection signals from microcontroller 160 and/or switches/fuses 170 may convey (e.g., to MUX/access circuit 124) the unique addresses or indices of the LUT entries. An example LUT will be described later in conjunction with FIG. 4.

In certain modes of operation (a "direct controller mode" and a "direct static signal mode," described below), MUX/access circuit 124 may receive the phase shift and attenuation values through the digital interface 128 (e.g., from microcontroller 160 and/or switches/fuses 170), and may provide the phase shift and attenuation values directly to controller circuit 122. In other modes of operation (a "controller LUT mode" and a "static signal LUT mode," also described below), the particular phase shift and attenuation data that the MUX/access circuit 124 accesses and provides to controller circuit 122 is dependent upon LUT entry selection signals received by MUX/access circuit 124 through the digital interface 128 (e.g., from microcontroller 160 and/or switches/fuses 170). A LUT entry selection signal identifies a particular LUT entry stored in memory 126 (e.g., a LUT entry selection signal may convey an address or index of a particular LUT entry).

The digital interface 128 may include, for example a serial interface (e.g., a serial peripheral interface (SPI)) and/or a parallel interface. For example, the digital interface 128 may include one or more inputs for receiving phase shift and attenuation values for storage in memory 126 or for provision to controller circuit 122, and/or for receiving LUT entry selection signals from microcontroller 160. In addition, the digital interface 128 may include one or more mode control inputs for receiving mode control signals (e.g., from microcontroller 160 or from external calibration equipment). According to yet another embodiment, the digital interface 128 may include one or more inputs for receiving phase shift and attenuation values (and/or LUT entry selection signals) from a plurality of switches and/or fuses 170. In addition to the above-described inputs, signal adjustment device 110 may include additional interfaces for receiving clock signals, reset signals, power, ground, and so on.

The phase shift and attenuation values and the LUT entry selection signals are received by MUX/access circuit 124 from the digital interface 128. When presented with phase shift and attenuation values, the MUX/access circuit 124 may either store the phase shift and attenuation values within memory 126, or may provide the phase shift and attenuation values to controller circuit 122, depending on the current operational mode of signal adjustment device 110. When presented with a LUT entry selection signal, the MUX/access circuit 124 may retrieve phase shift and attenuation values corresponding to the LUT entry selection signal from memory 126, and may provide the phase shift and attenuation values to controller circuit 122.

Essentially, the MUX/access circuit 124 is configured to direct data between the memory 126, the digital interface 128, and the controller circuit 122 based on whichever operational mode the signal adjustment device 110 currently is operating (the "current operational mode"). The current operational mode is defined by the state of a mode select signal received through the digital interface 128 (e.g., from microcontroller 160 and/or calibration equipment). According to an embodiment, at any given time, the signal adjustment device 110 may be operated in one of a variety of operational modes, including a LUT storage mode, a controller LUT mode, a static signal LUT mode, a direct controller mode, and a direct static signal mode, each of which will be described in more detail below. Other operational modes also may be defined. Further, more or fewer operational modes may be defined and supported by the system 100.

In order to store data corresponding to the LUT in the memory 126, the mode select signal is provided to device 110 with a state that places the signal adjustment device 110 in the LUT storage mode. Once in the LUT storage mode, data corresponding to the LUT entries is provided (e.g., by calibration equipment, microcontroller 160, or some other source) via the digital interface 128 to the device 110. The MUX/access circuit 124 receives the data from the digital interface 128, and stores (i.e., writes) the data in the LUT in memory 126. More specifically, the phase shift and attenuation values for each LUT entry are clocked into the device 110 through the digital interface 128, and the MUX/access circuit 124 stores the phase shift and attenuation values for each LUT entry in storage locations within memory 126 that correspond to the address or index corresponding to each LUT entry. The device 110 may be placed in the LUT storage mode, for example, in conjunction with a factory calibration procedure that may be performed before the device 110 is incorporated into system 100, such as the procedure described later in conjunction with FIG. 2. Alternatively, the device 110 may be placed in the LUT storage mode after the device is incorporated into system 100.

When the mode select signal is provided (e.g., by microcontroller 160 or some other source) to device 110 with a state that places the signal adjustment device 110 in the controller LUT mode, and a LUT entry selection signal identifying a particular LUT entry is provided (e.g., by microcontroller 160 or some other source) via the digital interface 128, the MUX/access circuit 122 accesses (i.e., reads) the phase shift and attenuation values stored within the phase shift and attenuation value fields for the LUT entry corresponding to the LUT entry selection signal, and provides those values to the controller circuit 122. The controller circuit 122 then controls the phase shifters 114, 116 and attenuators 118, 120 to apply corresponding phase shifts and attenuations to the RF signals being conveyed along amplification paths 106, 108. More specifically, in an embodiment in which each LUT entry includes two phase shift values and two attenuation values, the controller circuit 122 controls the first phase shifter 114 to apply a phase shift corresponding to the first phase shift value, controls the second phase shifter 116 to apply a phase shift corresponding to the second phase shift value, controls the first attenuator 118 to apply an attenuation corresponding to the first attenuation value, and controls the second attenuator 120 to apply an attenuation corresponding to the second attenuation value.

Microcontroller 160 may determine which LUT entry to indicate in the LUT entry selection signal based on one or more of a variety of operational conditions and/or other criteria. For example, microcontroller 160 may determine which LUT entry to indicate based on an evaluation of one or more current operational conditions that are selected from a temperature, a power of the input RF signal (e.g., at input 102), a power of the output RF signal (e.g., at output 104), a signal frequency (e.g., the fundamental or center frequency of the input RF signal), bias voltages applied to the amplifier stages 140, 142 (e.g., Vdd and/or Vgs), or other conditions.

According to an embodiment, a "calibration table" (e.g., calibration table 300, FIG. 3) is stored in memory 162, which enables microcontroller 160 to determine which LUT entry to select based on the current operational conditions.

According to an embodiment, when microcontroller 160 determines which LUT entry to indicate based on temperature, system 100 may include a temperature sensor 132, which provides a signal to microcontroller 160 that indicates a current temperature reading. For example, temperature sensor 132 may be placed in proximity to or may be integrated with amplifier circuit 130. Alternatively, temperature sensor 132 may be located elsewhere. When microcontroller 160 determines which LUT entry to indicate based on input RF signal power and/or output RF signal power, system 100 may include power meters 152 and/or 154 coupled to input 102 and/or output 104, respectively. The power meters 152, 154 each may sense the signal power at the nodes to which they are coupled, and may provided indications of the signal power to microcontroller 160. As will be described in more detail later, system 100 also may include memory 162 coupled to microcontroller 160, which includes data that enables microcontroller 160 to determine which LUT entry to indicate to device 110. More specifically, a calibration table (e.g., calibration table 300, FIG. 3) may be stored within memory 162, and the calibration table may enable microcontroller 160 to determine which LUT entry to indicate based on current operational conditions.

According to an embodiment, the mode select signal also may be provided (e.g., by microcontroller 160 or some other source) to device 110 with a state that places the signal adjustment device 110 in the static signal LUT mode, and a particular LUT entry may be provided by a static signal source (e.g., by switches/fuses 170, or some other source) via the digital interface 128. The signal source is considered to be "static," in that the signals provided by the source are not dynamically configurable, in an embodiment. For example, system 100 also may include a static signal source in the form of a set of switches (e.g., transistors, DIP switches, and so on) or fuses 170, each of which may be configured to convey a binary signal having a state, at any given time, corresponding to a logical "1" or a logical "0." According to an embodiment, the combination of signals from the switches/fuses 170 conveys, in parallel, the identity of a particular LUT entry (e.g., the address or index of a particular LUT entry). In such an embodiment, the MUX/access circuit 122 accesses (i.e., reads) the phase shift and attenuation values stored within the phase shift and attenuation value fields for that LUT entry, and provides those values to the controller circuit 122. The controller circuit 122 then controls the phase shifters 114, 116 and attenuators 118, 120 to apply corresponding phase shifts and attenuations to the RF signals being conveyed along amplification paths 106, 108, as described above.

According to an embodiment, when the mode select signal is provided (e.g., by microcontroller 160 or some other source) to device 110 with a state that places the signal adjustment device 110 in the direct controller mode and/or the direct static signal mode, the MUX/access circuit 122 provides phase shift and attenuation values directly from the digital interface 128 to the controller circuit 122, rather than reading the phase shift and attenuation values from the LUT in memory 126. In the direct controller mode, the phase shift and attenuation values may be received through the digital interface 128 from an external processing component (e.g., microcontroller 160 or some other processing component). In the direct static signal mode, the phase shift and attenuation values may be received through the digital interface 128 from an external static signal source (e.g., from switches/fuses 170 or some other source). According to an embodiment, the combination of signals from the switches/fuses 170 may convey, in parallel, one or more phase shift values and/or one or more attenuation values to be applied by the controller circuit 122. Once again, the MUX/access circuit 122 may receive the phase shift and attenuation values from the switches/fuses 170 via the digital interface 128, and provide the phase shift and attenuation values to the controller circuit 122.

In alternate embodiments, various ones of the above-described operational modes may not be supported by the device 110, in which case the corresponding system components and/or functionalities also may be excluded from the system 100. For example, in an embodiment in which the direct static signal mode and the external static signal LUT mode are not supported, switches/fuses 170 for conveying phase shift and/or attenuation values or LUT entry indicators may be excluded from the system 100. In an embodiment in which the direct controller mode and the controller LUT mode are not supported, microcontroller 160 may not provide phase shift and/or attenuation values or LUT entry indications to device 110.

According to an embodiment, the various components of device 110 are packaged together in a single device package (e.g., an air cavity package or an overmolded package). Further, the various components of device 110 may be implemented on a single integrated circuit chip (e.g., a single silicon chip (including silicon-on-insulator, silicon-on-sapphire, and so on), a single gallium-arsenide (GaAs) chip, a single gallium nitride (GaN) chip, or another type of semiconductor chip), or the various components may be implemented on different integrated circuit chips (e.g., multiple silicon chips, multiple gallium-arsenide chips, multiple GaN chips, multiple other types of semiconductor chips, or a combination of silicon, GaAs, GaN, or other chips).

As discussed previously, the phase shift and attenuation data for the LUT may be determined by microcontroller 160 or external calibration equipment during a calibration procedure. More specifically, in an embodiment, a "calibration table" may be generated during the calibration procedure, where the calibration table (or a portion thereof) is used by microcontroller 160 to determine which LUT entry to select at any given time. According to an embodiment, the LUT is derived from the calibration table. Once derived, the LUT may then be clocked into the device 110 and stored in the device's memory 126, and the calibration table (or a portion thereof) may be stored in the memory 162 that is accessible to microcontroller 160.

A large number of possible combinations exist for phase shifts and attenuations applied by phase shifters 114, 116 and attenuators 118, 120. For example, in system 100, if each phase shifter 114, 116 could be placed into any of eight phase shift states, and if each attenuator 118, 120 could be placed into any of 16 attenuation states, there are 16,384 possible combinations of different phase shift and attenuation states. Theoretically, a LUT may include a LUT entry for each possible state. However, according to an embodiment, the calibration procedure determines phase shifts and attenuations that configure the device 110 to meet desired performance criteria given particular operational conditions. Once the phase shifts and attenuations for a particular set of operational conditions are determined, those phase shifts and attenuations are stored in the calibration table. The LUT is derived from the calibration table.

Figure 2:
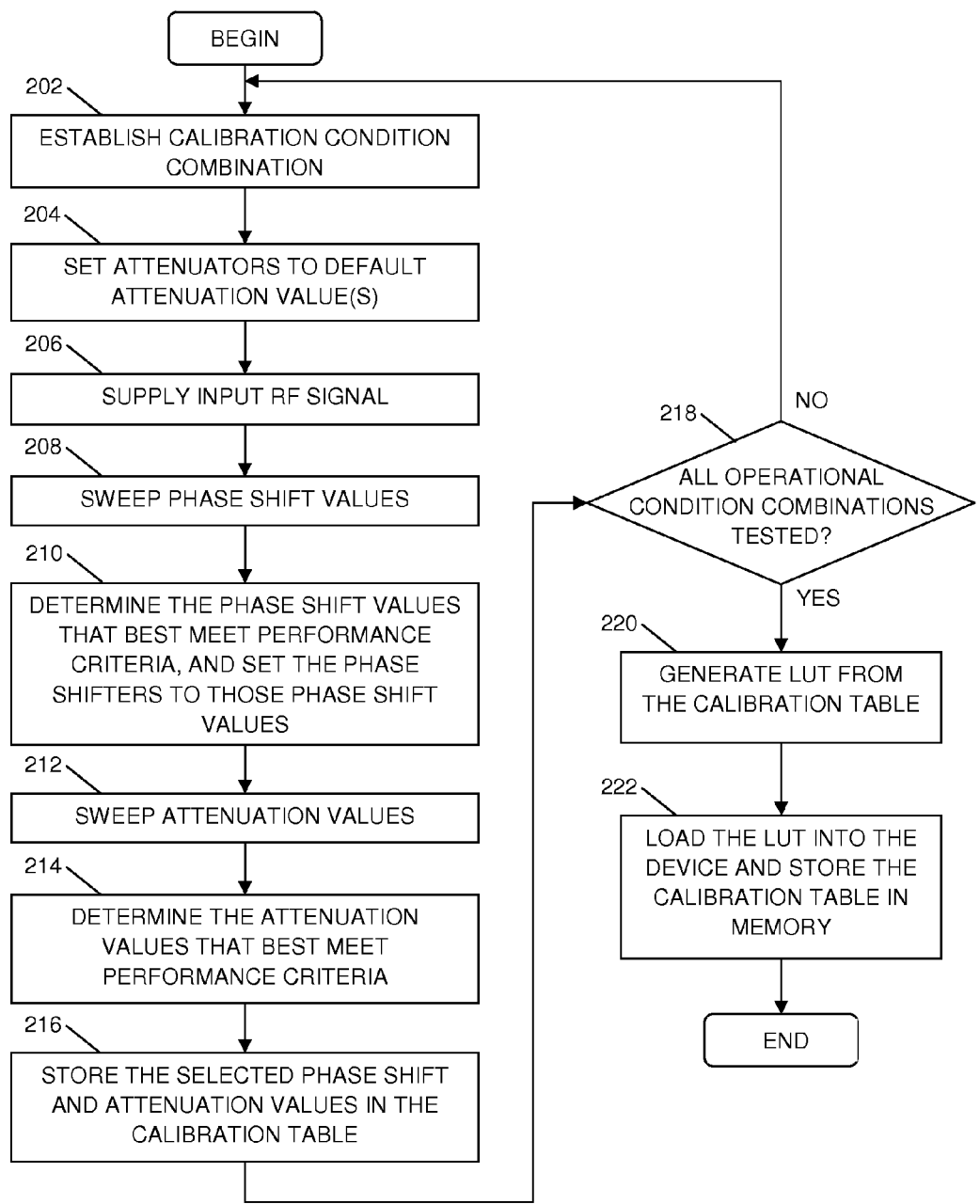
FIG. 2 illustrates a flowchart of a method for generating a calibration table and a lookup table, in accordance with an embodiment.

FIG. 2 illustrates a flowchart of a method for generating a calibration table (e.g., calibration table 300, FIG. 3) and a LUT (e.g., LUT 400, FIG. 4), in accordance with an embodiment. More specifically, the flowchart of FIG. 2 illustrates a particular method of determining, for various operational conditions, phase shifts and attenuations that meet desired performance criteria. In addition, the method includes generating a calibration table and a LUT that embody the determined phase shifts and attenuations. Although a particular example method for determining phase shifts and attenuations that meet certain desired performance criteria is depicted and described in conjunction with FIG. 2, it is to be understood that other calibration methods alternatively could be used that determine phase shifts and attenuations that meet additional or different performance criteria. The example calibration method of FIG. 2 is not to be construed as limiting, in that a variety of different calibration methods may be implemented to generate calibration and LUT data. Instead, the calibration method of FIG. 2 is provided only as an example of a possible calibration method that may be used.

During the calibration process, and according to an embodiment, current meters (not illustrated) are connected, respectively, to the current conducting terminals (e.g., drains or sources) of amplifier stages 140, 142. The current meters are configured to measure current flow through each amplification path 106, 108 of the system 100. A power meter (e.g., power meter 154) also is connected to the output 104 of the system 100, in an embodiment. The power meter may be configured to measure both a power generated by the amplifier circuit 130 as well as a peak-to-average power ratio (PAR) of the amplifier circuit 130. During calibration of the signal adjustment device 110, measurements produced by the current meters and output power meter are used in identifying a configuration of the set of adjustable attenuators 118, 120 and adjustable phase shifters 114, 116 that meets desired performance criteria for various combinations of operational conditions.

The method may be implemented, for example, by microcontroller 160 of FIG. 1. Alternatively, the method can be implemented by any device component or entity having the ability to control phase shifters 114, 116 and attenuators 118, 120 via digital interface 128, while also monitoring the output of the amplifier (e.g., calibration equipment that includes a host computer in communication with device 110). When implemented by microcontroller 160 or calibration equipment, the microcontroller 160 or the calibration equipment can be placed in communication with each of current and power meters to receive data therefrom. The data collected from the current and power meters can then be used in determining phase shifts and attenuations that meet the desired performance criteria from among a potentially large number of possible phase and attenuation states. According to an embodiment, the performance criteria include minimum efficiency and linearization targets, and the attenuation and phase values are selected to provide efficient amplifier operation that meets the amplifier's linearization requirements. Furthermore, the embodiments can be used to identify the values for attenuation and phase state that meet performance criteria other than or in addition to efficiency and linearization.

Essentially, the calibration process is an iterative process of establishing certain operational conditions, determining phase shift and attenuation values at which the device 110 may meet desired performance criteria under those operational conditions, and storing the phase shift an attenuation values within the calibration table. The method further includes deriving the LUT from the calibration table.

Referring now to FIG. 2, in block 202, a particular set of operational conditions is established for the system 100. For example, the set of operational conditions can include any combination of a device temperature (e.g., as sensed by temperature sensor 132), a power level of an input RF signal (e.g., at input 102), a power level of the output RF signal (e.g., at output 104), a frequency of the input RF signal (e.g., the fundamental or center frequency of the input RF signal), bias voltages applied to the amplifier stages 140, 142, or other conditions. Methods of establishing these operational conditions are not discussed in detail herein, although they would be apparent to one of skill in the art based on the description herein.

In block 204, the attenuators 118, 120 are set to default values. According to an embodiment, in order to set the attenuators 118, 120 to the default values, a mode control signal is provided to device 110 to place device 110 in the direct controller mode. Default attenuation and phase shift values are then provided to device 110 via the digital interface 128. According to an embodiment, the default attenuation levels of both the carrier and the peaking amplification paths 106, 108 (i.e., the attenuations applied by attenuators 118, 120) are set to be equal to one another. For example, this may involve setting the attenuation level applied along each path 106, 108 to 0 decibels (dB) or some other value. In an alternate embodiment, the attenuation levels of the carrier and the peaking amplification paths 106, 108 may be set to different values (e.g., values that correspond to the power ratio between carrier and peaking amplifiers).

With the attenuation level of each path 106, 108 set in step 204, an input signal (e.g., an RF signal) is supplied to the amplifier in step 206 (e.g., via input 102). The input signal may be selected to mimic the input signals that will be fed into the amplifier during normal use. In one embodiment, for example, the input signal mimics a digitally modulated signal commonly encountered in wireless communication applications. In other cases, the input signal may include an arbitrary waveform supplied to the signal adjustment device 110 that drives the amplifier sufficiently to draw current in both the carrier and peaking paths 106, 108. In one embodiment, the input signal is selected to have sufficient power to achieve a 6-7 dB output back-off. Further, the input signal may be characterized by a particular fundamental frequency and/or a particular input RF signal power, which may be considered to be operational conditions under which the device 110 is being tested. The output power also may be measured, at this point, and the gain of the amplifier stages 140, 142 may be adjusted to achieve a desired output power level.

With the input signal being supplied to the amplifier, in step 208 the phase shifts of the carrier and peaking paths 106, 108 are swept through a number of possible combinations (e.g., the phase shifters 114, 116 are controlled by microcontroller 160 or calibration equipment to apply different combinations of phase shifts to the input signal while the attenuation applied by attenuators 118, 120 is held constant) and the output signal is measured for each combination. Each combination of phase shifts of the carrier and peaking paths 106, 108 may be referred to as a phase state of the device 110. In one embodiment, step 208 involves sweeping the carrier and peaking paths 106, 108 through all possible phase shift combinations or phase states. In other embodiments, only a subset of available phase states that surround a nominal, or default, phase shift between paths are swept (e.g., in a conventional Doherty amplifier the nominal phase shift is 90 degrees). For example, if a relative phase sweep of fewer than 180 degrees is considered sufficient (e.g., because such a sweep is considered to cover a sufficient number of different phase states around 90 degrees), it may be sufficient to consider only a subset of the available phase states.

During the execution of step 208, when the first and second adjustable phase shifters 114, 116 are set in each candidate phase state, the current (e.g., drain current) through each path 106, 108, and the output power and PAR of the output signal from the amplifier are measured. In one embodiment, the output power and PAR of the output signal (e.g., at output 104) are captured by a power meter (e.g., power meter 154), while the currents of each path 106, 108 are captured by current meters (not illustrated). Having captured that data, the amplifier's performance can be calculated for each candidate phase state using the output power and the total current values. For example, the amplifier's performance may be quantified in terms of efficiency, maximum peak output power, or using other metrics. In block 210, the phase shift values that best meet the desired performance criteria are identified, and the phase shifters 114, 116 are set to those values.

In block 212, with the phase shifts of the carrier and peaking paths 106, 108 invariant, the attenuation states of the amplifier's carrier and peaking paths 106, 108 are swept. More particularly, the attenuations applied along the carrier and peaking paths 106, 108 are swept through a number of possible combinations (e.g., the attenuators 118, 120 are controlled by microcontroller 160 or calibration equipment to apply different combinations of attenuations to the signals on paths 106, 108 while the phase shifts applied by phase shifters 114, 116 is held constant) and the output signal (e.g., at output 104) is measured for each combination. In one embodiment, all possible attenuation levels on both paths 106, 108 are swept. In an alternate embodiment, the adjustable attenuators 118, 120 may be swept through a subset of all possible attenuation states. At each candidate attenuation state, the amplifier's efficiency is measured. Then, in block 214, the attenuation state at which the amplifier best meets performance criteria (e.g., the state with the highest amplifier efficiency in light of linearity and peak output power criteria) is identified.

A single iteration of blocks 208-214 may be performed, in an embodiment. In an alternate embodiment, multiple iterations of blocks 208-214 may be performed, and the finally-determined phase shift and attenuation values determined in blocks 210 and 214 may be based on multiple measurements. Either way, in block 216, the phase shift and attenuation values determined in blocks 210 and 214 are stored in an entry of the calibration table that corresponds to the operational conditions under which the device 110 was tested. In block 218, a determination is made whether all operational condition combinations have been tested. If not, then a different combination of calibration conditions is established in block 202, and the method iterates as shown. For example, the device 110 may be re-tested at a different temperature, using a different input signal frequency, at different bias voltages, at a different input signal power level, and/or at a different output signal power level. According to an embodiment, a new entry is generated in the calibration table for each different combination of operational conditions under which the device 110 is tested.

For example, FIG. 3 illustrates an example of a calibration table 300, in accordance with an embodiment. Calibration table 300 includes a plurality of entries, with each entry corresponding to a set of operational conditions, and including phase shifts and attenuations that were determined to meet performance criteria under those operational conditions (e.g., phase shifts and attenuations determined in blocks 210, 214). For example, each entry may include an index field (e.g., field 302), one or more fields corresponding to operational conditions (e.g., fields 304, 306, 308), one or more fields corresponding to attenuation settings (e.g., fields 310, 312), and one or more fields corresponding to phase shift settings (e.g., fields 314, 316).

The index field 302 includes a value (e.g., an integer) that enables a particular entry to be uniquely identified. The frequency field 304 may specify a frequency of the input RF signal provided to the device 110 when the phase shift and attenuation values were determined. For example, the frequency field 304 may specify the fundamental or center frequency of the input signal. Alternatively, the frequency field 304 may indicate a frequency range that is centered around the fundamental or center frequency of the input signal. The temperature field 306 includes a value indicating the device or ambient temperature when the phase shift and attenuation values were determined. The power field 308 includes a value indicating input RF signal power and/or output RF signal power when the phase shift and attenuation values were determined. Finally, the attenuation and phase shift fields 310, 312, 314, 316 include the attenuation and phase shift values determined (e.g., in blocks 210, 214) while the device 110 was being tested under the operational conditions specified in fields 304, 306, 308. Although not illustrated in FIG. 3, each entry also may have one or more bias voltage fields, as well, indicating bias voltages applied to one or more of the amplifier stages.

The calibration table 300 is configured to store calibration information for two attenuators (e.g., attenuators 118, 120) and two phase shifters (e.g., phase shifters 114, 116) under various combinations of operational conditions that include frequency, temperature, and signal power. Those of skill in the art would understand, based on the description herein, that each entry may include more, fewer or different fields from those depicted in FIG. 3 (e.g., fields for more, fewer or different operational conditions (including bias voltages), more or fewer attenuation fields, and/or more or fewer phase shifter fields). Further, as indicated by the example operational condition values in fields 304, 306, and 308, the example calibration process was used to test device under a range of frequencies between 2110 megahertz (MHz) to 2200 MHz, temperatures from 0 degrees Celsius to 150 degrees Celsius, and input or output power levels of 1 dB to 30 dB. Further, as indicated by the example attenuation and phase shift values in fields 310, 312, 314, and 316, attenuations in a range between 0 dB and 7.5 dB and phase shifts in a range between 0 degrees and 49 degrees may be specified for any given combination of operational conditions. In other embodiments, the calibration table data may span frequency ranges, temperature ranges, power level ranges, attenuation level ranges, and/or phase shift ranges that are different from what is indicated in FIG. 3. Further, although FIG. 3 is shown to include 256 entries, a calibration table may include more or fewer entries, as well. These comments regarding the variability of the calibration table apply equally to the example LUT discussed below and illustrated in FIG. 4.

Referring again to FIG. 2, once the determination is made in block 218 that all operational condition combinations have been tested, the calibration table may be considered to be complete. In block 220, the LUT may then be generated from the calibration table. According to an embodiment, the LUT essentially includes a subset of the fields and data from the calibration table. More specifically, the LUT may include only the index field, the attenuation fields, and the phase shift fields. For example, FIG. 4 illustrates an example of a LUT 400, in accordance with an embodiment, where LUT 400 was derived from calibration table 300. More specifically, LUT 400 includes the same fields and data as calibration table 300, except that LUT 400 excludes the fields and data associated with the operational conditions (e.g., fields 304, 306, 308). That being said, each LUT entry includes an index field (e.g., field 402), one or more fields corresponding to attenuation settings (e.g., fields 404, 406), and one or more fields corresponding to phase shift settings (e.g., fields 408, 410).

Referring again to FIG. 2, in block 222, the LUT (e.g., LUT 400) is loaded into memory 126 of the device 110. According to an embodiment, the LUT is loaded by providing a mode control signal to device 110, which places device 110 in the LUT storage mode. Once in the LUT storage mode, the LUT may be clocked into the device 110 through the digital interface 128. Within the device 110, the MUX/access circuit 124 transfers the LUT data from the digital interface 128 to the memory 126.

In addition, in block 222, the calibration table (e.g., calibration table 300) is stored in memory 162, so that the calibration table may be accessible to the microcontroller 160 during operation. According to one embodiment, the entire calibration table is stored in memory 162. In another embodiment, only those fields of the calibration table that would be accessed by the microcontroller 160 during operation are stored in memory 162. For example, as will be explained in more detail later, the microcontroller 160 may not support the direct controller LUT mode (e.g., the operational mode in which the microcontroller 160 provides phase shift and attenuation values directly to device 110, rather than providing LUT entry indications). In that case, the phase shift and attenuation fields of the calibration table need not be stored in memory 162. Once the LUT is loaded into device 110, and the calibration table is stored in memory 162, the system may be ready for operation.

Figure 5:
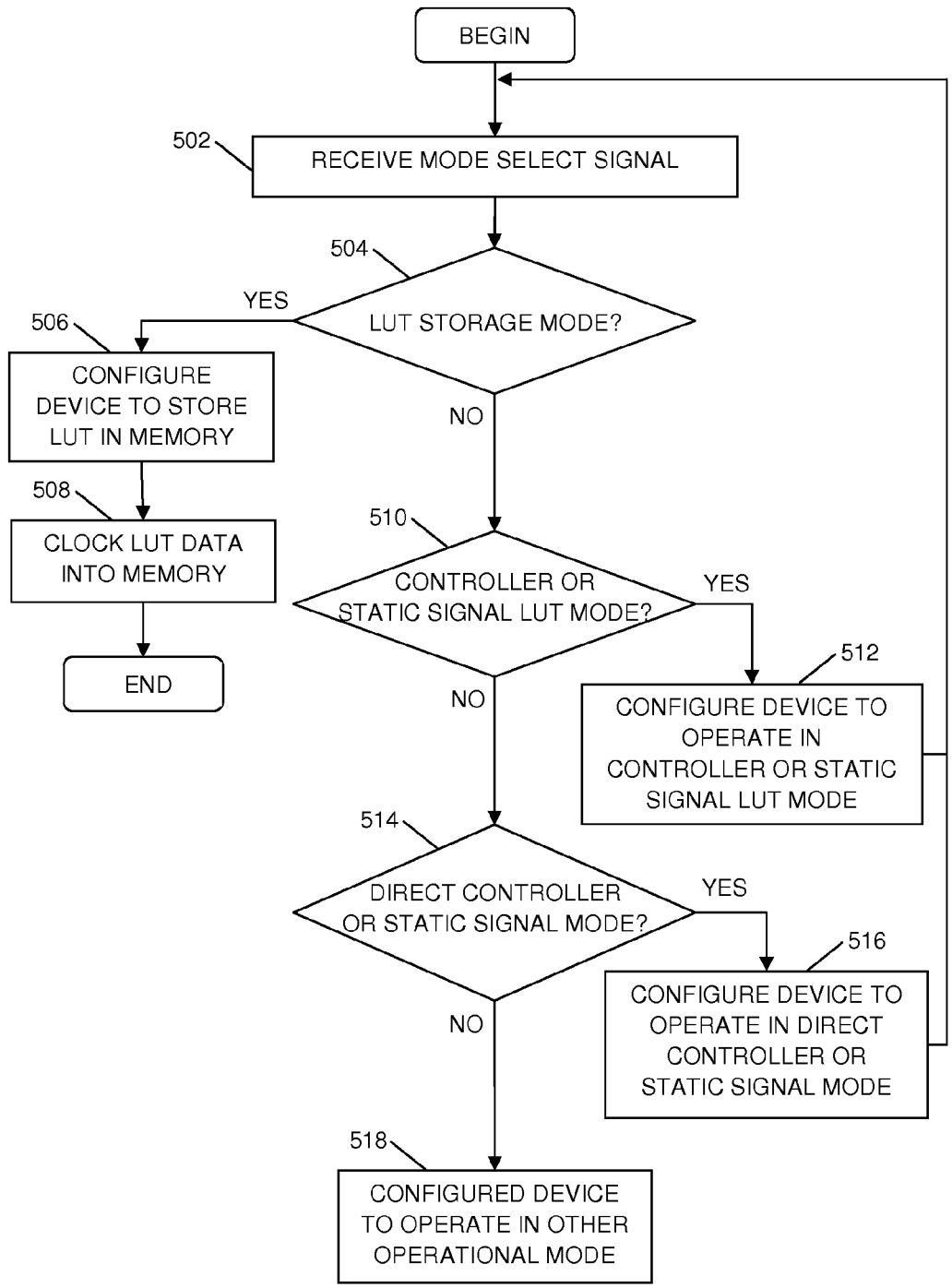
FIG. 5 illustrates a flowchart of a method for controlling operations of a signal adjustment device based on a mode signal, in accordance with an embodiment.

FIG. 5 illustrates a flowchart of a method for controlling operations of a signal adjustment device (e.g., device 110) based on a mode control signal, in accordance with an embodiment. For example, the various blocks of the method illustrated in FIG. 5 may be performed by the signal adjustment device (e.g., by logic of the device, including logic associated with MUX/access circuitry 124). For example, the method may be performed in an amplifier system, such as system 100, in which the signal adjustment device is coupled between an input (e.g., input 102) and amplifier stages (e.g., amplifier stages 140, 142) of the amplifier system. In addition, the system may include a microcontroller (e.g., microcontroller 160) and/or static signal sources (e.g., switches/fuses 170) coupled to the signal adjustment device. In other embodiments, the method may be performed in a system that is differently configured.

As discussed previously, and according to an embodiment, the signal adjustment device may be operated in any of a plurality of operational modes, including a LUT storage mode, a controller LUT mode, a static signal LUT mode, a direct controller mode, and a direct static signal mode, each of which was described in detail above. As also discussed previously, the signal adjustment device also may support more, fewer or different operational modes. In any event, the operational mode in which the signal adjustment device is operating at any given time may be controlled by a mode select signal provided by an external source via the digital interface (e.g., digital interface 128). For example, the mode select signal may be provided by a microcontroller (e.g., microcontroller 160), calibration equipment or some other source.

The method begins, in block 502, when the signal adjustment device receives the mode select signal (e.g., through digital interface 128 from microcontroller 160, calibration equipment, or some other source). For example, the mode select signal may be a parallel digital signal in which each of the multiple operational modes may be identified by a unique digital value (e.g., LUT storage mode may be identified with "001", controller LUT mode may be identified with "010", static signal LUT mode may be identified with "011", direct controller mode may be identified with "100", and direct static signal mode may be identified with "101"). In other embodiments, the mode select signal may be received through a serial interface, and/or may convey a desired mode of operation in a different manner.

Once the signal adjustment device has received the mode select signal, logic of the device may configure the device to operate in the operational mode that corresponds to the current state of the mode select signal. In FIG. 5, this logic is depicted as a series of decision blocks 504, 508, 512, which may be implemented in any order or in parallel. In any event, in block 504, when the signal adjustment device determines that the mode select signal has a state corresponding to the LUT storage mode, the device configures itself to receive and store data corresponding to the LUT into memory of the device (e.g., memory 126), in block 506. More specifically, the circuitry of the device (e.g., MUX/access circuitry 124) is configured to receive LUT data that is clocked into the digital interface, and to perform a series of writes to the device memory that results in storing the LUT data into the memory. In block 508, the LUT data actually may be clocked into the device and stored into the memory.

In block 510, when the signal adjustment device determines that the mode select signal has a state corresponding to the controller or static signal LUT modes, the device configures itself to operate in a LUT mode, in block 512. More particularly, the device configures itself so that, when it receives a LUT entry selection signal through the digital interface (e.g., from microcontroller 160 in the controller LUT mode, or from switches/fuses 170 in the static signal LUT mode), circuitry (e.g., MUX/access circuitry 124) will read, from memory (e.g., memory 126), the phase shift and attenuation values for the LUT entry that corresponds to the LUT entry selection signal. The circuitry (e.g., MUX/access circuitry 124) will then provide the phase shift and attenuation values to controller circuitry (e.g., controller circuitry 122), which will cause the device's phase shifters and attenuators (e.g., phase shifters 114, 116 and attenuators 118, 120) to apply phase shifts and attenuations corresponding to the values.

In block 514, when the signal adjustment device determines that the mode select signal has a state corresponding to the direct controller or static signal modes, the device configures itself to operate in a direct mode, in block 516. More particularly, the device configures itself so that, when it receives signals that convey phase shifts and/or attenuation values through the digital interface (e.g., from microcontroller 160 in the direct controller mode, or from switches/fuses 170 in the direct static signal mode), circuitry (e.g., MUX/access circuitry 124) will provide the phase shift and attenuation values directly to controller circuitry (e.g., controller circuitry 122). The controller circuitry then will cause the device's phase shifters and attenuators (e.g., phase shifters 114, 116 and attenuators 118, 120) to apply phase shifts and attenuations corresponding to the values. As indicated by block 518, in other embodiments, mode control signals may be provided that have states that are different from those discussed in more detail herein. In such embodiments, the device may be configured to operate in those other operational modes.

Figure 6:
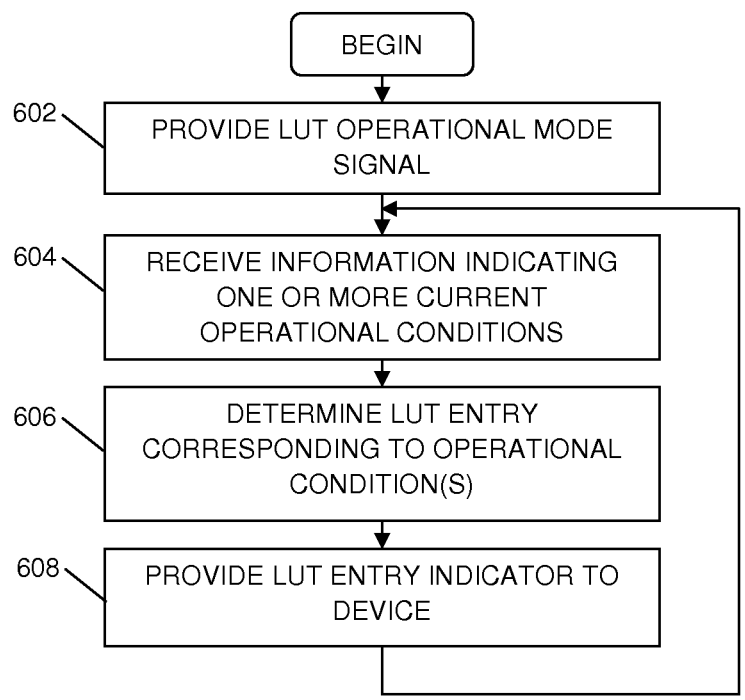
FIG. 6 illustrates a flowchart of a method for determining a lookup table entry and for providing an indication of the lookup table entry to the signal adjustment device, in accordance with an embodiment.

More details regarding operation in the controller and static signal LUT modes will now be provided. In particular, FIG. 6 illustrates a flowchart of a method for determining a LUT entry based on current operational conditions, and for providing an indication of an LUT entry to the signal adjustment device (e.g., device 110), in accordance with an embodiment. For example, the method may be performed by control circuitry (e.g., microcontroller 160) that is external to and coupled to the signal adjustment device. The method may begin, in block 602, when the external control circuitry provides a LUT mode select signal to the signal adjustment device, which indicates that the signal adjustment device should configure itself in the controller LUT mode.

As indicated previously, the control circuitry may determine which LUT entry it will indicate to the signal adjustment device based on current operational conditions. For example, this determination may be made based on a current temperature (e.g., an ambient or device temperature), a current operating frequency (e.g., a fundamental or center frequency of the RF signal at input 102), a signal power level (e.g., peak power or PAR of the input RF signal at input 102 or the output RF signal at output 104), bias voltages applied to the amplifier stages, or other conditions. Accordingly, in block 604, the control circuitry may receive information indicating one or more current operational conditions. For example, in the system of FIG. 1, microcontroller 100 may receive temperature information from temperature sensor 132, and input and output signal power information from power meters 152, 154. In addition, the microcontroller 100 may receive or have knowledge of the current operating frequency and/or bias voltages.

In block 606, the control circuitry may use the current operational condition information to select an entry from a calibration table that is accessible to the control circuitry (e.g., calibration table 300, which is stored in memory 162). For example, in a system that evaluates current frequency, temperature, and signal power in determining which entry to select, the system may select an entry in which the stored values for frequency, temperature, and signal power (e.g., values stored in fields 304, 306, 308 of calibration table 300) are closest to the current operational conditions. As a more specific example, assuming that the control circuitry receives information indicating that the current frequency is about 2110 MHz, the current temperature is about 0 degrees Celsius, and the current signal power level is about 5 dB, the control circuitry may select the entry associated with index 2 in calibration table 300.

After the control circuitry selects a calibration table entry that corresponds to the current operating conditions, the control circuitry provides a LUT entry indicator to the signal control device, in block 608. For example, in the system of FIG. 1, microcontroller 160 may provide the LUT entry indicator to the signal adjustment device 110 through digital interface 128. In an embodiment, and as indicated previously, the entries in the calibration table that is accessible to the control circuitry (e.g., calibration table 300 stored in memory 162) may have corresponding entries in the LUT that is stored in the signal adjustment device (e.g., LUT 400 stored in memory 126). In such an embodiment, the LUT entry indicator may include the index corresponding to the calibration table entry that was selected in block 606. In alternate embodiments, the indices in the calibration table and the LUT may not correspond directly to each other, and/or the LUT entry indicator may be made using some other information. After providing an initial LUT entry indicator, the control circuitry continues to monitor the operational conditions, and may provide a different LUT entry indicator when the operational conditions change to states that correspond to a different entry in the calibration table.

The description of the method of FIG. 6 corresponds to operation in the controller LUT mode. As discussed previously, however, the system also or alternatively may operate in the static signal LUT mode. In the static signal LUT mode, the method of providing a LUT entry indicator to the signal adjustment device is performed by circuitry configured to provide a LUT entry indicator that does not change over time (e.g., switches/fuses 170). Accordingly, in the static signal LUT mode, the method of providing the LUT entry indicator to the signal adjustment device may include just block 608 of FIG. 6. For example, in the system of FIG. 1, switches/fuses 170 may provide the LUT entry indicator to device 110 through the digital interface 128. If both the controller LUT mode and the static signal LUT mode are supported by the device, MUX/access circuitry 124 would be configured to receive the LUT entry indicator from the portion of the digital interface 128 associated with the microcontroller 160 or from the portion of the digital interface 128 associated with the switches/fuses 170 based on the state of the mode select signal.

Figure 7:
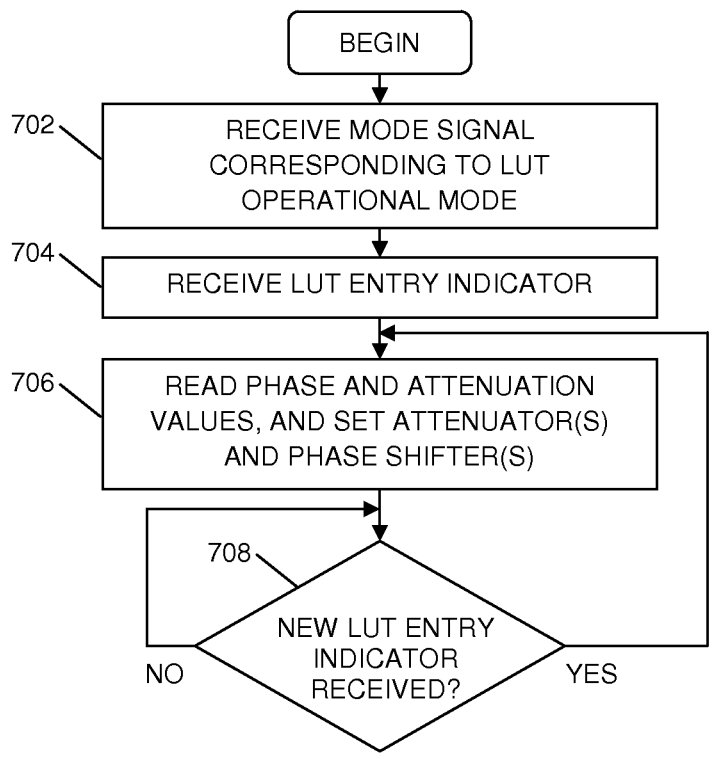
FIG. 7 illustrates a flowchart of a method for controlling a signal adjustment device in a lookup table operational mode, in accordance with an embodiment.

Having described the functioning of external control circuitry (e.g., microprocessor 160) in the controller LUT mode in conjunction with FIG. 6, the functionality of the signal adjustment device (e.g., device 110) in the controller LUT mode (and the static signal LUT mode) will now be described in conjunction with FIG. 7. More specifically, FIG. 7 illustrates a flowchart of a method for a signal adjustment device (e.g., device 110) to operate in a LUT operational mode, in accordance with an embodiment. For example, the method may be performed by the signal adjustment device (e.g., device 110). The method may begin, in block 702, when the signal control device receives a LUT mode select signal, which indicates that the signal adjustment device should configure itself in either the controller LUT mode or the static signal LUT mode.

In block 704, the signal adjustment device receives a LUT entry indicator from external circuitry (e.g., from microcontroller 160 or switches/fuses 170). The signal adjustment device receives the LUT entry indicator through a digital interface (e.g., digital interface 128), in an embodiment. Because the signal adjustment device is configured in a LUT mode, receipt of the LUT entry indicator causes circuitry (e.g., MUX/access circuitry 124) to read, from memory (e.g., memory 126), the phase shift and attenuation values for the LUT entry that corresponds to the LUT entry selection signal in block 706. For example, referring also to LUT 400 in FIG. 4, receipt of a LUT entry indicator that identifies the LUT entry with index "2" will cause the circuitry to read the phase shift and attenuation values in fields 404, 406, 408, 410 of the LUT entry for index 2. The circuitry (e.g., MUX/access circuitry 124) provides the phase shift and attenuation values to controller circuitry (e.g., controller circuitry 122), which sets the device's phase shifters and attenuators (e.g., phase shifters 114, 116 and attenuators 118, 120) to apply phase shifts and attenuations corresponding to the values to signals carried on the system's amplification paths (e.g., paths 106, 108).

At any time during operation, if the signal adjustment device receives a new LUT entry indicator, as indicated by block 708, block 706 is repeated. The process iterates for as long as the signal adjustment device remains in the LUT mode. Note that, in the static signal LUT mode, the same LUT entry indicator may be provided to the signal adjustment device for as long as the device remains in the static signal LUT mode. Accordingly, receipt of different LUT entry indicators is likely to occur only in the controller LUT mode.

Figure 8:
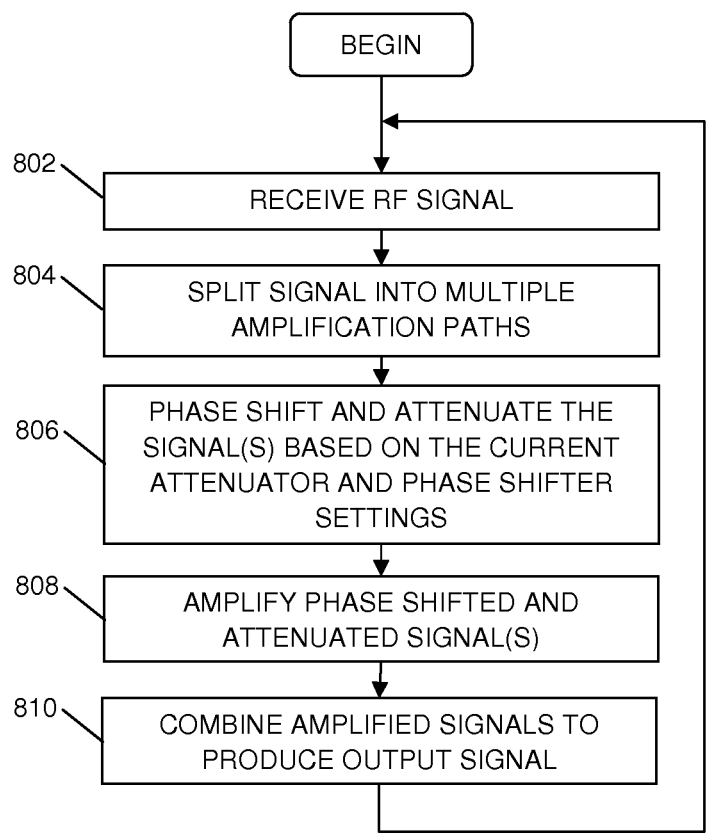
FIG. 8 illustrates a flowchart of a method for amplifying a signal using a system that includes a signal adjustment device, in accordance with an embodiment.

FIG. 8 illustrates a flowchart of a method for amplifying a signal using a system (e.g., system 100) that includes a signal adjustment device (e.g., device 110), in accordance with an embodiment. For example, portions of the method may be performed by the signal adjustment device, while other portions of the method may be performed by downstream components of an amplifier system (e.g., by amplifier stages 140, 142 and combiner 150).

In block 802, the system receives an input RF signal (e.g., at input 102). In block 804, the power of the received signal may be split (e.g., by power splitter 112) into two or more signals, each of which will be further processed along a distinct amplification path (e.g., paths 106, 108). In block 806, each signal is then phase shifted and attenuated (e.g., by phase shifters 114, 116 and attenuators 118, 120) based on the current settings of the phase shifters and attenuators along the respective paths (i.e., the settings established by the controller circuitry in block 706 of FIG. 7).

In block 808, the phase shifted and attenuated signals are amplified (e.g., by amplifier stages 140, 142). The amplified signals may then be combined, in block 810, by a combiner circuit (e.g., combiner circuit 150) to produce an amplified output RF signal (e.g., at output 104). According to an embodiment, the combiner circuit also may apply a phase shift to one or more of the signals to ensure that the signals are summed in phase before being provided to the output terminal.

Although the flowchart of FIG. 8 shows the various process blocks occurring sequentially, in actual operation the process blocks would be performed in parallel (e.g., an RF signal would be being received while other portions of the signal simultaneously were being split, phase shifted, attenuated, amplified, and combined). Further, although the illustrations depict an amplifier system and signal adjustment device that include two amplification paths (e.g., paths 106, 108), the inventive subject matter also may be used in systems with a single amplification path or more than two amplification paths. Further, although the illustrated signal adjustment devices include a power splitter (e.g., power splitter 112) coupled to multiple series-coupled phase shifters and attenuators, another embodiment of a signal adjustment device may exclude the power splitter. Although the series coupled phase shift and attenuation circuits show the phase shifters (e.g., phase shifters 114, 116) downstream of the attenuators (e.g., attenuators 118, 120) in each amplification path, the attenuators may be downstream of the phase shifters, in another embodiment. In still other embodiments, the signal adjustment device may include only phase shifters or only attenuators, but not both. In still other embodiments, one path may include an adjustable phase shifter (but not an adjustable attenuator), and the other path may include an adjustable attenuator (but not an adjustable phase shifter). In still another embodiment, only one of the paths may include a series coupled adjustable phase shifter and attenuator, while the other path does not include them. These and other modifications are intended to be included within the scope of the inventive subject matter.

An embodiment of a device includes a first node configured to receive a first input RF signal, a second node configured to produce a first output RF signal, and a first RF signal adjustment circuit coupled between the first node and the second node. The first RF signal adjustment circuit includes a first adjustable phase shifter and a first adjustable attenuator coupled in series with each other. The device also includes a memory configured to store a first phase shift value and a first attenuation value, and a controller circuit configured to control the first adjustable phase shifter to apply a first phase shift corresponding to the first phase shift value to the first input RF signal, and to control the first adjustable attenuator to apply a first attenuation corresponding to the first attenuation value to the first input RF signal. Applying the first phase shift and the first attenuation results in the first output RF signal.

An embodiment of an amplifier system includes a modifiable signal adjustment device that includes a first node configured to receive a first input RF signal, a second node configured to produce a first output RF signal, and a first RF signal adjustment circuit coupled between the first node and the second node. The first RF signal adjustment circuit includes a first adjustable phase shifter and a first adjustable attenuator coupled in series with each other. The modifiable signal adjustment device also includes a memory configured to store a first phase shift value and a first attenuation value, and a controller circuit configured to control the first adjustable phase shifter to apply a first phase shift corresponding to the first phase shift value to the first input RF signal, and to control the first adjustable attenuator to apply a first attenuation corresponding to the first attenuation value to the first input RF signal. Applying the first phase shift and the first attenuation results in the first output RF signal.

A method of processing an RF signal includes retrieving a first phase shift value and a first attenuation value from a memory of a signal adjustment device, controlling a first adjustable phase shifter of the signal adjustment device to apply a first phase shift corresponding to a first phase shift value to a first input RF signal, and controlling a first adjustable attenuator of the signal adjustment device to apply a first attenuation corresponding to a first attenuation value to the first input RF signal. Applying the first phase shift and the first attenuation results in the first output RF signal. The first adjustable attenuator is coupled in series with the first adjustable phase shifter.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to the present invention, further discussion of such structures and ICs, if any, will be limited to the essentials with respect to the principles and concepts of the various embodiments.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
    a power splitter configured to receive an input radio frequency (RF) signal and to split a power of the input RF signal to produce first and second input RF signals that are 90 degrees out of phase with each other;
    a first node configured to receive the first RF signal;
    a second node configured to produce a first output RF signal;
    a third node configured to receive the second input RF signal;
    a fourth node configured to produce a second output RF signal;
    a first RF signal adjustment circuit coupled between the first node and the second node, wherein the first RF signal adjustment circuit includes a first adjustable phase shifter and a first adjustable attenuator coupled in series with each other;

a second RF signal adjustment circuit coupled between the third node and the fourth node, wherein the second RF signal adjustment circuit includes a second phase shifter and a second attenuator coupled in series with each other;

a memory configured to store a first phase shift value and a first attenuation value;

a controller circuit configured to control the first adjustable phase shifter to apply a first phase shift corresponding to the first phase shift value to the first input RF signal, and to control the first adjustable attenuator to apply a first attenuation corresponding to the first attenuation value to the first input RF signal, wherein applying the first phase shift and the first attenuation results in the first output RF signal, and a first interface configured to receive the first phase shift value and the first attenuation value;

a second interface configured to receive a mode select signal; and diversion circuitry coupled to the first and second interfaces, which is configured to provide the first phase shift value and the first attenuation value to the memory when the mode select signal has a first state, and to provide the first phase shift value and the first attenuation value to the controller circuit for controlling the first adjustable phase shifter and the first adjustable attenuator when the mode select signal has a second state that is different from the first state.

2. The device of claim 1, wherein:
the first interface is selected from a serial interface and a parallel interface.

3. The device of claim 1, wherein:
the memory is further configured to store a lookup table that includes a plurality of lookup table entries, wherein each lookup table entry includes a first phase shift value field and a first attenuation value field, and wherein a first lookup table entry of the plurality of lookup table entries has the first phase shift value stored within the first phase shift value field, and has the first attenuation value stored within the first attenuation value field, and other lookup table entries have other phase shift values stored within the first phase shift value field, and have other attenuation values stored within other attenuation value fields.

4. The device of claim 3, wherein:
the first interface is configured to receive the other phase shift values, and the other attenuation values; and
the diversion circuitry is configured to store the first phase shift value, the first attenuation value, the other phase shift values, and the other attenuation values in the lookup table in the memory.

5. The device in claim 1, further comprising:
an air cavity package that contains the first node, the second node, the first RF signal adjustment circuit, the memory, the diversion circuitry, and the controller circuit.

6. The device in claim 1, further comprising:
an overmolded package that contains the first node, the second node, the first RF signal adjustment circuit, the memory, the diversion circuitry, and the controller circuit.

7. An amplifier system comprising:
a modifiable signal adjustment device that includes
a first node configured to receive a first input radio frequency (RF) signal,
a second node configured to produce a first output RF signal, a first RF signal adjustment circuit coupled between the first node and the second node, wherein the first RF signal adjustment circuit includes a first adjustable phase shifter and a first adjustable attenuator coupled in series with each other, a memory configured to store a first phase shift value, a first attenuation value, and a lookup table that includes a plurality of lookup table entries, wherein each lookup table entry includes a first phase shift value field and a first attenuation value field, and wherein a first lookup table entry of the plurality of lookup table entries has the first phase shift value stored within the first phase shift value field, and has the first attenuation value stored within the first attenuation value field, and other lookup table entries have other phase shift values stored within the first phase shift value field, and have other attenuation values stored within other attenuation value fields, a first interface configured to receive a lookup table entry indicator that indicates a selected lookup table entry of the plurality lookup table entries, wherein the first interface is selected from a serial digital interface and a parallel digital interface, wherein the first interface is a parallel interface comprising a plurality of lines, access circuitry configured to access a selected phase shift value and a selected attenuation value from the selected lookup table entry in response to receiving the lookup table entry indicator, and a controller circuit configured to control the first adjustable phase shifter to apply a first phase shift corresponding to the first phase shift value to the first input RF signal, and to control the first adjustable attenuator to apply a first attenuation corresponding to the first attenuation value to the first input RF signal, wherein applying the first phase shift and the first attenuation results in the first output RF signal, and wherein the controller circuit is configured to control the first adjustable phase shifter to apply a phase shift corresponding to the selected phase shift value to the first input RF signal, and to control the first adjustable attenuator to apply an attenuation corresponding to the selected attenuation value to the first input RF signal; and a plurality of static signal sources coupled to the plurality of lines, wherein ach of the static signal sources conveys a binary signal to the line to which each of the plurality of static signal sources is coupled, and wherein a combination of binary signals provided by the plurality of static signal sources represents the lookup table entry indicator.

8. The amplifier system of claim 7, further comprising:
a processor coupled to the first interface, wherein the processor determines the lookup table entry indicator based on an evaluation of one or more current operational conditions, wherein the current operational conditions are selected from a temperature, a power of an input RF signal to the modifiable signal adjustment device, a power of an output RF signal of the system, a bias voltage, and a signal frequency, and wherein the processor provides the lookup table entry indicator to the first interface as a digital value.

9. The amplifier system of claim 8, further comprising:
an amplifier coupled between an amplifier input and an amplifier output, wherein the amplifier input is coupled to the first output of the modifiable signal adjustment device, the amplifier is configured to amplify the first output RF signal provided by the modifiable signal adjustment device, and the amplifier is configured to produce an amplified RF signal at the amplifier output, and wherein the processor determines the lookup table entry indicator based on an evaluation of a detected power of the amplified RF signal at the amplifier output.

10. The amplifier system of claim 8, further comprising:
a temperature sensor coupled to the processor, wherein the temperature sensor is configured to sense a temperature of the amplifier system, and to provide a temperature indication to the processor, and wherein
the processor is configured to determine the lookup table entry indicator based on an evaluation of the temperature.

11. The amplifier system of claim 7, further comprising:
an amplifier having a first amplifier stage coupled between a first amplifier input and a first amplifier output, wherein the first amplifier input is coupled to the second node of the modifiable signal adjustment device, and the first amplifier stage is configured to amplify the first output RF signal provided by the modifiable signal adjustment device at the second node in order to produce a first amplified RF signal at the first amplifier output.

12. The amplifier system of claim 7, further comprising:
a third node configured to receive a second input RF signal;
a fourth node configured to produce a second output RF signal;
a second RF signal adjustment circuit coupled between the third node and the fourth node, wherein the second RF signal adjustment circuit includes a second adjustable phase shifter and a second adjustable attenuator coupled in series with each other;
a first amplifier stage coupled between a first amplifier input and a first amplifier output, wherein the first amplifier input is coupled to the second node, and the first amplifier stage is configured to amplify the first output RF signal provided by the modifiable signal adjustment device at the second node in order to produce a first amplified RF signal at the first amplifier output;
a second amplifier stage coupled between a second amplifier input and a second amplifier output, wherein the second amplifier input is coupled to the third node, and the second amplifier stage is configured to amplify a second output RF signal provided at the fourth node in order to produce a second amplified RF signal at the second amplifier output; and
a power combiner with a first combiner input coupled to the first amplifier output, a second combiner input coupled to the second amplifier output, and a combiner output, wherein the power combiner is configured to combine the first amplified RF signal and the second amplified RF signal to produce a combined RF output signal at the combiner output.

13. The amplifier system of claim 12, wherein the amplifier is a Doherty amplifier, the first amplifier stage is a main amplifier, and the second amplifier stage is a peaking amplifier.

14. The device in claim 1, wherein:
the second phase shifter is adjustable;
the second attenuator is adjustable;
the memory is further configured to store a second phase shift value and a second attenuation value;
the controller is further configured to control the second phase shifter to apply a second phase shift corresponding to the second phase shift value to the second input RF signal, and to control the second attenuator to apply a second attenuation corresponding to the second attenuation value to the second input RF signal, wherein applying the second phase shift and the second attenuation results in the second output RF signal; the first interface is configured to receive a second phase shift value and a second attenuation value; and
the diversion circuitry is configured to provide the second phase shift value and the second attenuation value to the memory when the mode select signal has the first state, and to provide the second phase shift value and the second attenuation value to the controller circuit for controlling the second phase shifter and the second attenuator when the mode select signal has the second state.

\* \* \* \* \*